United States Patent
Akejima

(10) Patent No.: US 12,009,282 B2
(45) Date of Patent: Jun. 11, 2024

(54) MEMORY DEVICE AND MEMORY DEVICE MODULE

(71) Applicant: MEIKO ELECTRONICS CO., LTD., Ayase (JP)

(72) Inventor: Shuzo Akejima, Yokohama Kanagawa (JP)

(73) Assignee: MEIKO ELECTRONICS CO., LTD., Ayase (JP)

( * ) Notice: Subject to any disclaimer, the term of this patent is extended or adjusted under 35 U.S.C. 154(b) by 0 days.

(21) Appl. No.: 18/258,190

(22) PCT Filed: Mar. 11, 2021

(86) PCT No.: PCT/JP2021/009826
§ 371 (c)(1),
(2) Date: Jun. 16, 2023

(87) PCT Pub. No.: WO2022/190316
PCT Pub. Date: Sep. 15, 2022

(65) Prior Publication Data
US 2023/0411237 A1    Dec. 21, 2023

(51) Int. Cl.
*H01L 23/367*   (2006.01)
*H01L 23/538*   (2006.01)
*H01L 25/065*   (2023.01)

(52) U.S. Cl.
CPC ...... *H01L 23/3677* (2013.01); *H01L 23/5383* (2013.01); *H01L 23/5386* (2013.01); *H01L 25/0655* (2013.01); *H01L 2225/1094* (2013.01)

(58) Field of Classification Search
CPC ............. H01L 23/3677; H01L 23/5383; H01L 23/5386; H01L 25/0655; H01L 2225/1094
See application file for complete search history.

(56) References Cited

U.S. PATENT DOCUMENTS 8,811,019 B2   8/2014   Gottwald
9,589,945 B2   3/2017   Jo
(Continued)

FOREIGN PATENT DOCUMENTS

JP       5767338 B2    8/2015
JP    2016207785 A   12/2016
(Continued)

*Primary Examiner* — Kyoung Lee
*Assistant Examiner* — Christina A Sylvia
(74) *Attorney, Agent, or Firm* — Kim & Stewart LLP

(57) ABSTRACT

A memory device includes: a wiring substrate including a multilevel wiring layer and first and second surfaces at opposite sides; a control element embedded in the wiring substrate and having first and second element surfaces at opposite sides, with multiple electrode pads connected to the multilevel wiring layer at the first element surface; a first heat dissipation member at a region of the first surface overlapping the control element; a heat dissipation structure facing the second element surface and exposed at the second surface; and at least one memory element connected with the multilevel wiring layer at a first surface region not overlapping the control element. The multilevel wiring layer includes a signal pattern electrically connecting the control element with the memory element or the external connection terminal, and a heat dissipation conductor pattern forming a heat dissipation path between the control element and the first heat dissipation member.

11 Claims, 18 Drawing Sheets

(56) References Cited

U.S. PATENT DOCUMENTS

| | | |
|---|---|---|
| 9,842,799 B2 * | 12/2017 | Jang ................. H01L 25/105 |
| 10,211,190 B2 * | 2/2019 | Kim ................. H01L 25/50 |
| 2013/0329370 A1 | 12/2013 | Gottwald |
| 2015/0084170 A1 * | 3/2015 | Im ................. H01L 23/3677 |
| | | 438/107 |
| 2016/0093598 A1 | 3/2016 | Jo |
| 2016/0307818 A1 | 10/2016 | Kawase |
| 2018/0211944 A1 * | 7/2018 | Kim ................. H01L 24/20 |
| 2019/0139853 A1 * | 5/2019 | Oh ................. H01L 23/562 |
| 2019/0229100 A1 * | 7/2019 | Im ................. H01L 23/42 |
| 2019/0237412 A1 * | 8/2019 | Lee ................. H01L 23/367 |
| 2020/0294954 A1 | 9/2020 | Shiroi |

FOREIGN PATENT DOCUMENTS

| | | |
|---|---|---|
| JP | 6584258 B2 | 10/2019 |
| JP | 2020150192 A | 9/2020 |

* cited by examiner

MEMORY DEVICE AND MEMORY DEVICE MODULE

TECHNICAL FIELD

The invention relates to a memory device and a memory device module.

BACKGROUND ART

A SSD (Solid State Drive) has a configuration in which a NAND memory element and a control element (a controller) that controls the memory element are mounted on a wiring substrate. Recent advances in higher memory capacity and faster operation have led to higher performance of the control element and increased heat generation. There are cases where the operation speed (the programming speed and/or the reading speed) of the memory element must be reduced when the memory element temperature also increases due to the heat of the control element.

PRIOR ART DOCUMENTS

Patent Literature

[Patent Literature 1]
JP 5767338
[Patent Literature 2]
JP 6584258

SUMMARY OF INVENTION

Technical Problem

The invention is directed to a memory device and a memory device module in which heat dissipation of a control element is increased.

Solution to Problem

According to an aspect of the invention, a memory device includes: a wiring substrate including a first surface, a second surface at a side opposite to the first surface, and a multilevel wiring layer; a control element embedded in the wiring substrate, and including a first element surface at which multiple electrode pads that are connected with the multilevel wiring layer are located, and a second element surface at a side opposite to the first element surface; a first heat dissipation member located at a region of the first surface of the wiring substrate overlapping the control element; a heat dissipation structure that faces the second element surface of the control element and is exposed at the second surface of the wiring substrate; and at least one memory element that is located at a region of the first surface of the wiring substrate not overlapping the control element and is connected with the multilevel wiring layer. The multilevel wiring layer includes a signal pattern electrically connecting the control dement with the memory element or an external connection terminal, and a heat dissipation conductor pattern forming a heat dissipation path between the control element and the first heat dissipation member.

DESCRIPTION OF EMBODIMENTS

Figure 1:
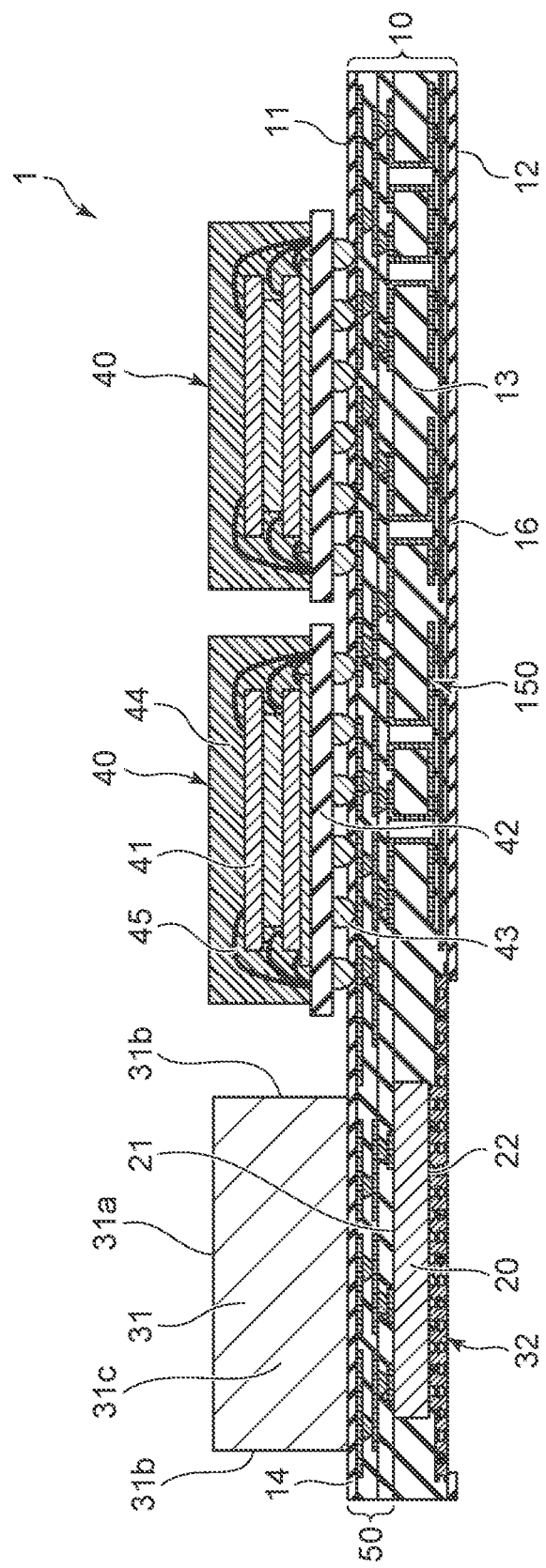
FIG. 1 is a schematic cross-sectional view of a memory device of a first embodiment.

Embodiments will now be described with reference to the drawings. The same configurations are marked with the same reference numerals in the drawings.

First Embodiment

FIG. 1 is a schematic cross-sectional view of a memory device 1 of a first embodiment.

The memory device 1 includes a wiring substrate 10, a control element 20, at least one memory element 40, a first heat dissipation member 31, and a heat dissipation structure 32. Although not illustrated, connectors, chip capacitors, etc., are mounted to the wiring substrate 10. For example, the connectors function as external connection terminals that are electrically connected with an external circuit.

The wiring substrate 10 includes a first surface 11, a second surface 12 at the side opposite to the first surface 11, a multilevel wiring layer 50, and an insulating layer 13. The multilevel wiring layer 50 is a metal layer and is made of, for example, copper. The insulating layer 13 is located between layers of the multilevel wiring layer 50. The insulating layer 13 is, for example, a resin layer made of an epoxy resin.

The control element 20 is embedded in the wiring substrate 10. The control element 20 is, for example, a silicon chip semiconductor element that is not resin-molded, and includes a first element surface 21 at which several hundred electrode pads are located, and a second element surface 22 at the side opposite to the first element surface 21. The first element surface 21 is oriented toward the first surface 11 side of the wiring substrate 10; and the second element surface 22 is oriented toward the second surface 12 side of the wiring substrate 10. The side surface of the control element 20 is covered with the insulating layer 13 of the wiring substrate 10.

Figure 7:
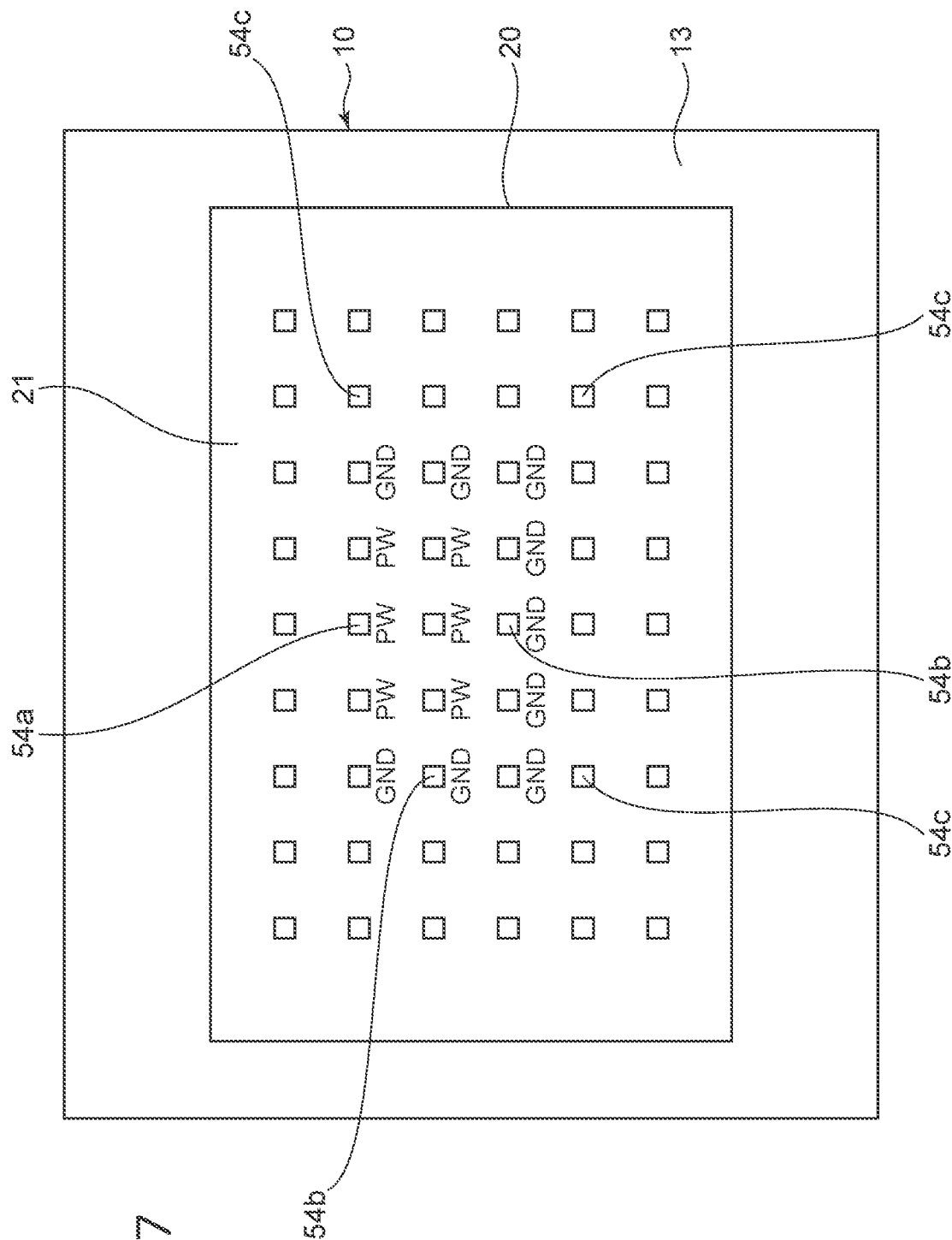
FIG. 7 is a schematic plan view of a first element surface of the control element of the memory device of the first embodiment.

FIG. 7 is a schematic plan view of the first element surface 21 of the control element 20.

An integrated circuit for controlling the reading/programming of a memory element 40 is formed in the control element 20. Multiple electrode pads 54a, 54b, and 54c that are electrically connected with the integrated circuit are located at the first element surface 21. The electrode pads 54a, 54b, and 54c are electrically connected with the multilevel wiring layer 50 of the wiring substrate 10.

The electrode pads of the control element 20 include multiple power supply pads 54a marked "PW" in FIG. 7 and multiple ground pads 54b marked "GND" in FIG. 7, A power supply potential is applied to the power supply pads 54a; and a ground potential is applied to the ground pads 54b. The electrode pads further include multiple signal pads 54c, Various signals are transmitted via the signal pads 54c between the control element 20 and the memory element 40 and/or between the control element 20 and external connection terminals to which input signals from the outside are input.

As shown in FIG. 1, the first heat dissipation member 31 is located at the region of the first surface 11 of the wiring substrate 10 overlapping the control element 20, For example, the first heat dissipation member 31 is a metal member that includes multiple fins. An upper surface 31a and side surfaces 31b and 31c of the first heat dissipation member 31 are not covered with the wiring substrate 10 on the first surface 11. The lower surface of the first heat dissipation member 31 faces the first element surface 21 of the control element 20 via the multilevel wiring layer 50. The height of the first heat dissipation member 31 is greater than the height of the memory element 40.

The heat dissipation structure 32 is located to face the second element surface 22 of the control element 20. The surface of the heat dissipation structure 32 at the side opposite to the surface facing the second element surface 22 is exposed at the second surface 12 of the wiring substrate 10.

Multiple memory elements 40 are located at the region of the first surface 11 of the wiring substrate 10 not overlapping the control element 20. A first direction from the first heat dissipation member 31 toward the memory elements 40 is orthogonal to a second direction from the control element 20 toward the first heat dissipation member 31. Also, a third direction from the control element 20 toward the memory elements 40 is tilted with respect to the first and second directions.

The memory element 40 has a package structure in which multiple memory chips 41 are stacked on a substrate 42 and sealed with a resin 44. The memory chips 41 are, for example, NAND memory. Metal wires 45 electrically connect the memory chips 41 and a wiring layer formed in the substrate 42. The resin 44 covers the multiple memory chips 41 and the metal wires 45. Multiple terminals (e.g., solder balls) 43 that are electrically connected with the wiring layer of the substrate 42 are located at the back side of the substrate 42. The terminals 43 are electrically connected with the multilevel wiring layer 50 of the wiring substrate 10. The memory element 40 can be operated even at high temperatures by reducing the performance to maintain the operation quality by reducing the programming/reading operation speeds when about 80° C. is exceeded.

Figure 2:
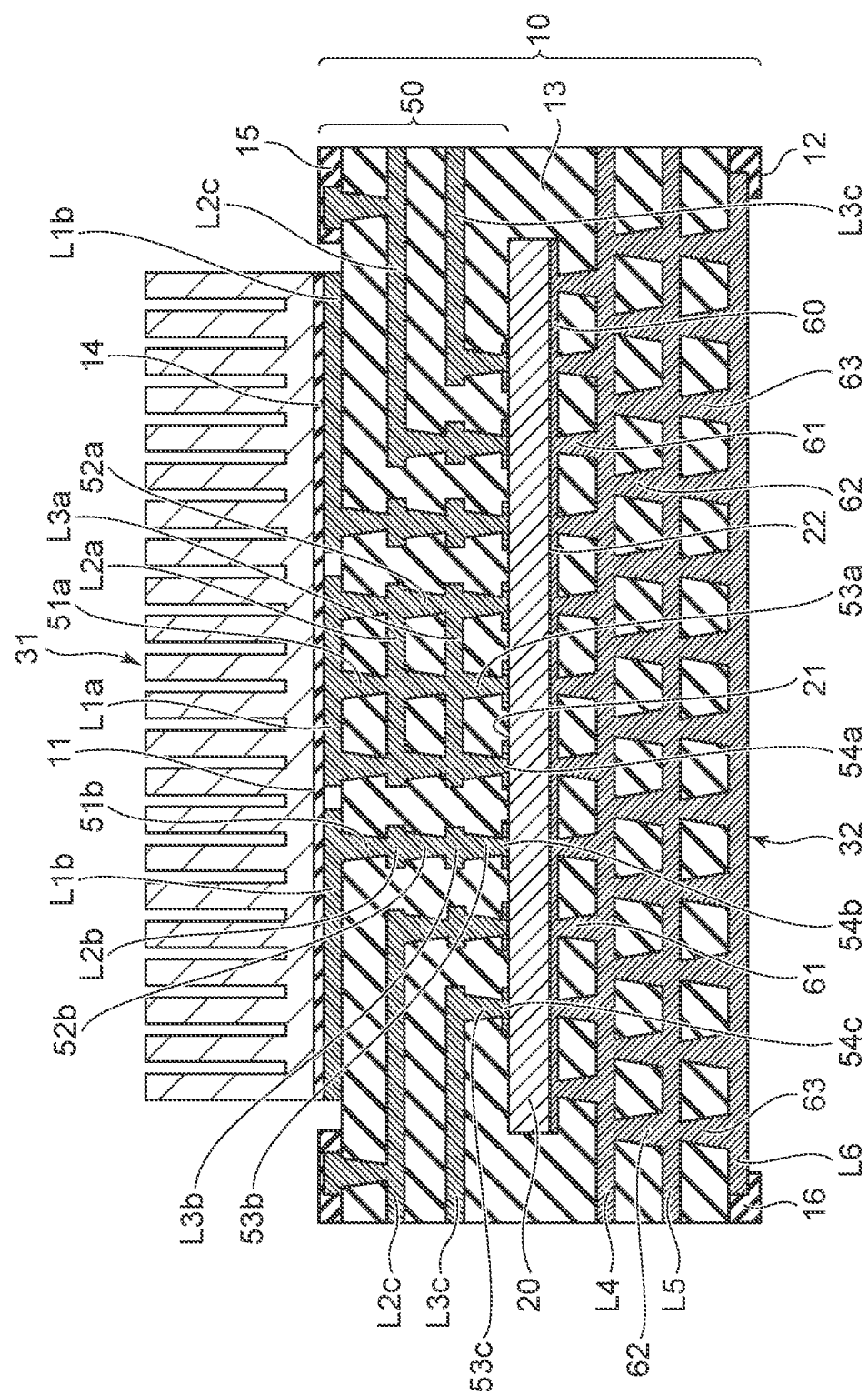
FIG. 2 is a detailed schematic cross-sectional view of a portion of the memory device of the first embodiment in which the control dement and the first heat dissipation member are located.

FIG. 2 is a detailed schematic cross-sectional view of a portion of the memory device 1 in which the control element 20 and the first heat dissipation member 31 are located.

For example, three layers of wiring layers (conductor patterns L1a to b, L2a to c, and L3a to c) are located between the first heat dissipation member 31 and the first element surface 21 of the control element 20. Interlayer connections between the wiring layers are made by multiple vias. The number of layers of wiring layers between the control element 20 and the first heat dissipation member 31 is not limited thereto and may be two layers, four layers, or more.

The multilevel wiring layer 50 includes signal patterns L2c and L3c that electrically connect the control element 20 and the memory element 40, and the heat dissipation conductor patterns L1a, L1b, L2a, L2b, L3a, and L3b that thermally connect the control element 20 and the first heat dissipation member 31. The heat dissipation conductor patterns L1a, L1b, L2a, L2b, L3a, and L3b form a heat dissipation path between the control element 20 and the first heat dissipation member 31.

Figure 3:
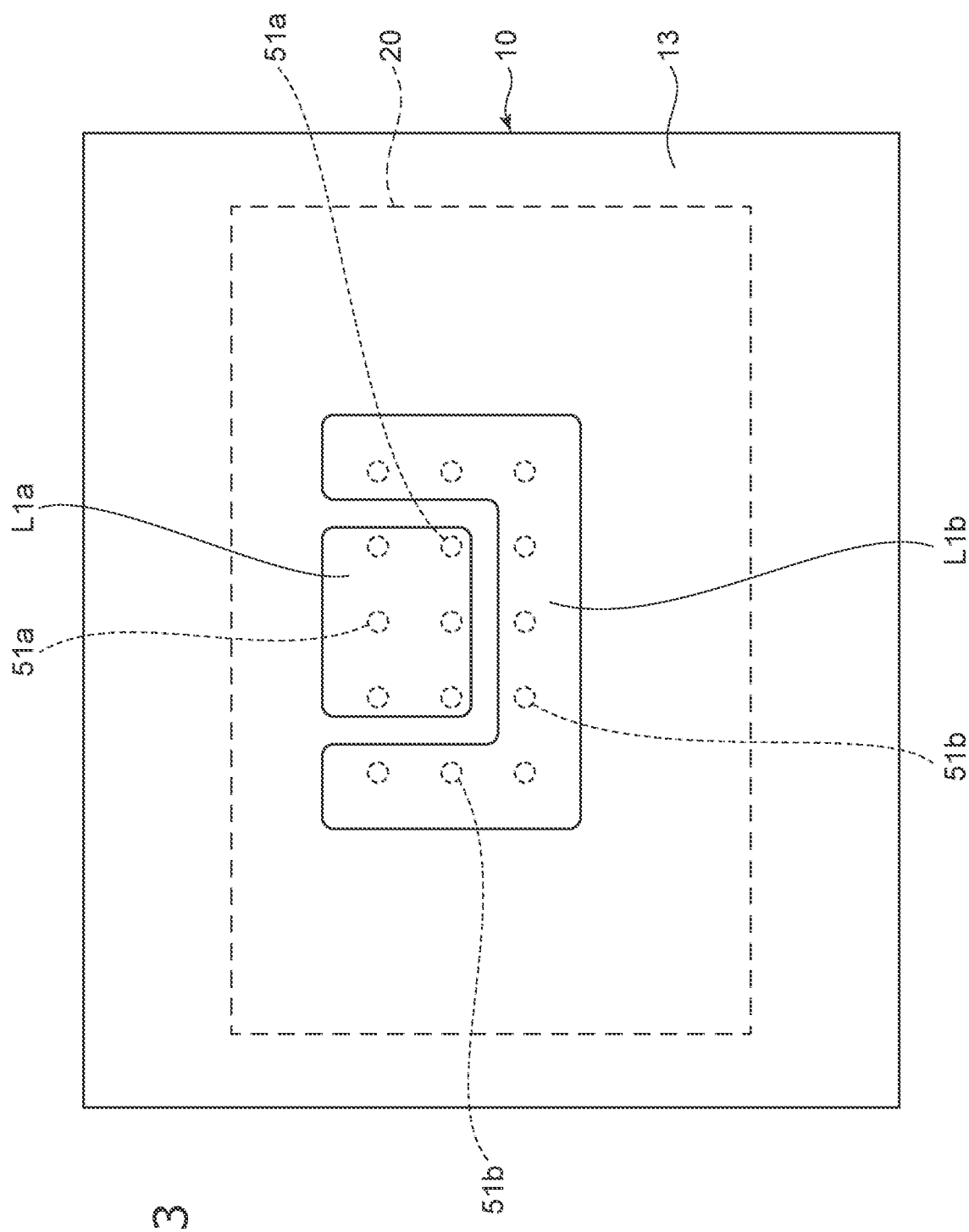
FIG. 3 is a schematic plan view of a wiring layer of a wiring substrate of the memory device of the first embodiment.

FIG. 3 is a schematic plan view of a wiring layer of the uppermost layer at the first surface 11 side of the wiring substrate 10. The wiring layer of the uppermost layer includes the first power supply pattern Lia and the first ground pattern Lib. The first power supply pattern Lia is used as both a power supply pattern that applies the power supply potential and a heat dissipation conductor pattern that is thermally connected with the first heat dissipation member 31. The first ground pattern Lib is used as both a ground pattern that applies the ground potential and a heat dissipation conductor pattern that is thermally connected with the first heat dissipation member 31.

The width of the first power supply pattern Lia and the width of the first ground pattern Lib are greater than the width of the signal pattern; and the first power supply pattern Lia and the first ground pattern Lib are formed in plate shapes.

As shown in FIG. 2, the first heat dissipation member 31 is located on the first power supply pattern Lia and on the first ground pattern Lib. A thermally-conductive insulating member 14 is located between the first power supply pattern Lia and the first heat dissipation member 31 and between the first ground pattern Lib and the first heat dissipation member 31.

The signal pattern of the uppermost layer is covered with a dielectric protective film (a solder resist) 15.

Figure 4:
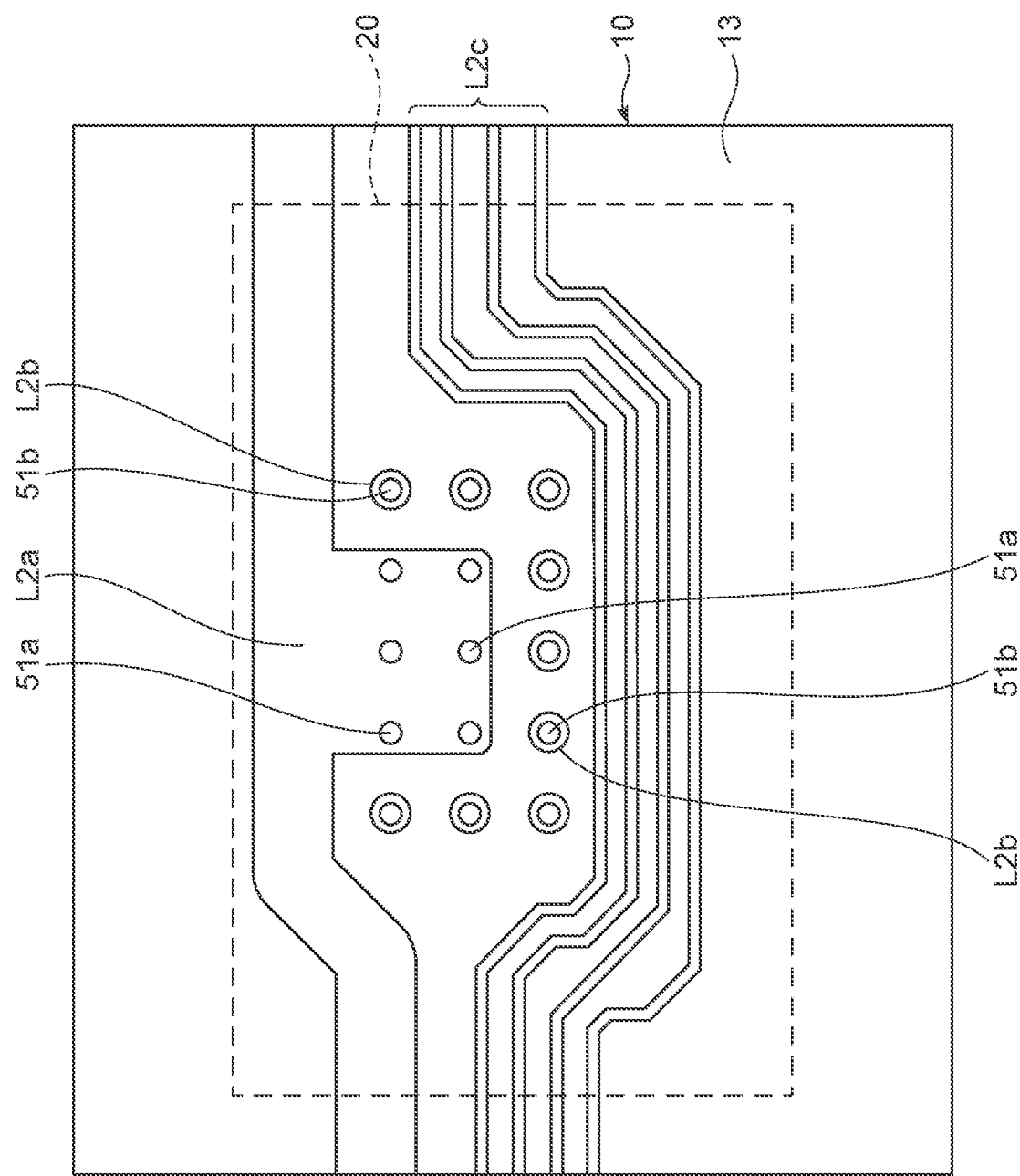
FIG. 4 is a schematic plan view of a wiring layer of the wiring substrate of the memory device of the first embodiment.

FIG. 4 is a schematic plan view of a wiring layer at a layer under the wiring layer shown in FIG. 3. The second power supply pattern L2a, the second ground pattern L2b, and the second signal pattern L2c are located in the layer shown in FIG. 4.

The second signal pattern L2c is formed in multiple line shapes. The second signal pattern L2c electrically connects the signal pads 54c of the control element 20 with the memory element 40 and/or external connection terminals to which input signals from the outside are input.

The second power supply pattern L2a is formed in a plate shape having a greater width than the second signal pattern L2c and extends into the region in which the memory element 40 is located. The second power supply pattern L2a is electrically connected with the first power supply pattern L1a by multiple vias 51a. The second power supply pattern L2a is used as both a power supply pattern and a heat dissipation conductor pattern.

The second ground pattern L2b is formed in multiple island shapes. The second ground pattern L2b is electrically connected with the first ground pattern L1b by vias 51b. The second ground pattern L2b is used as both a ground pattern and a heat dissipation conductor pattern.

Figure 5:
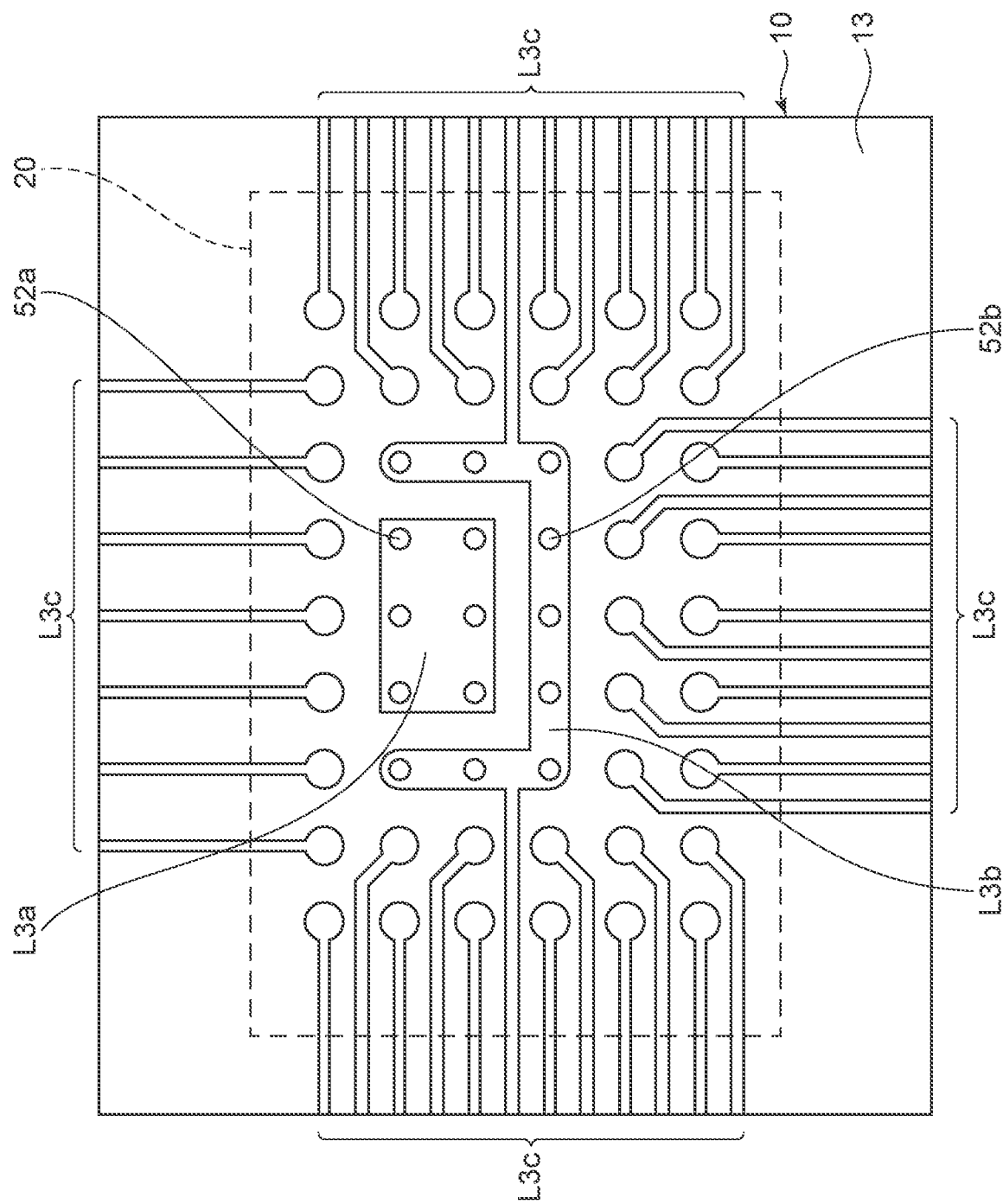
FIG. 5 is a schematic plan view of a wiring layer of the wiring substrate of the memory device of the first embodiment.
Figure 6:
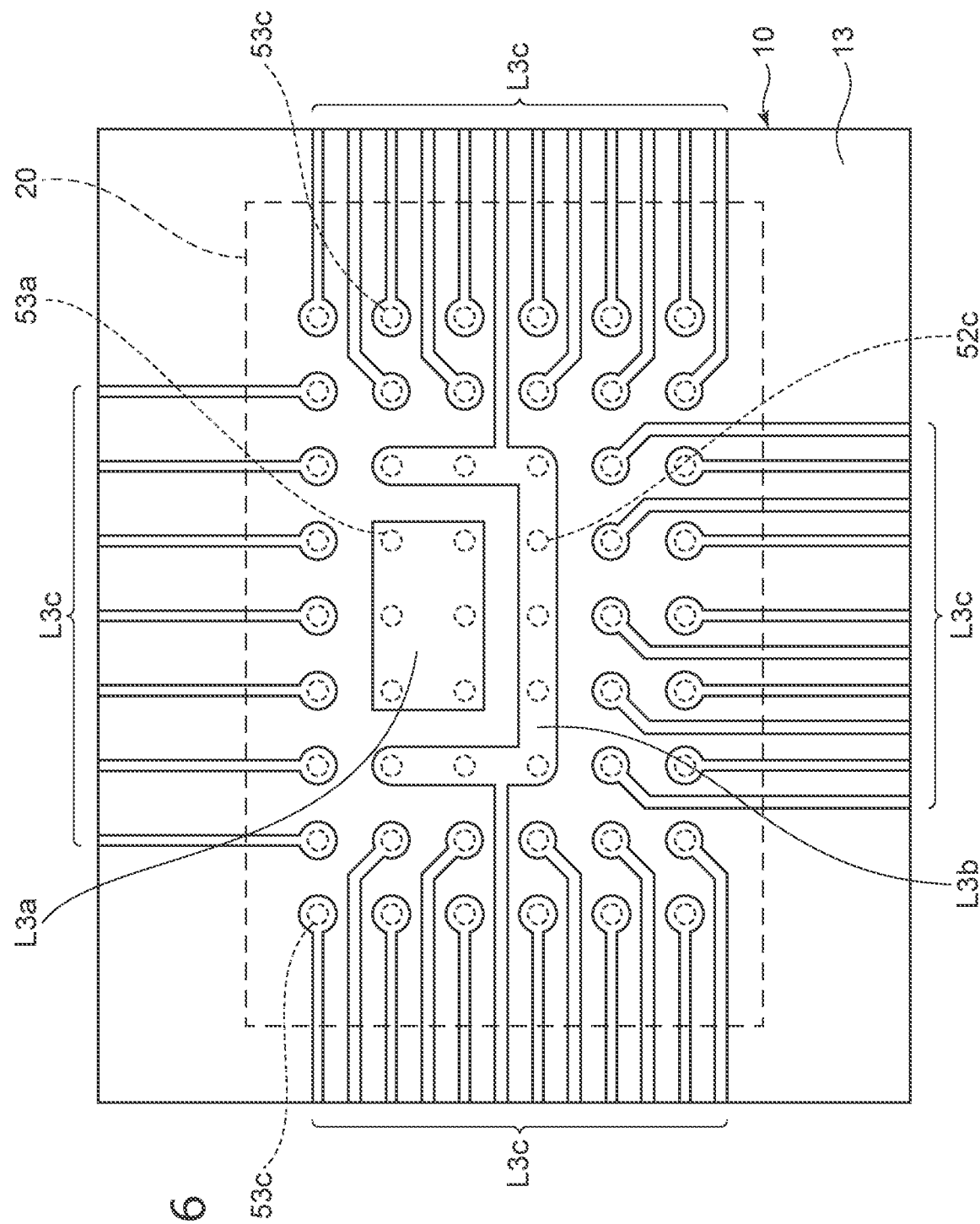
FIG. 6 is a schematic plan view of a wiring layer of the wiring substrate of the memory device of the first embodiment.

FIGS. 5 and 6 are schematic plan views of a wiring layer at the layer under the wiring layer shown in FIG. 4. The third power supply pattern L3a, the third ground pattern L3b, and the third signal pattern L3c are located in the layer shown in FIGS. 5 and 6.

The third signal pattern L3c is formed in multiple line shapes. The third signal pattern L3c electrically connects the signal pads 54c of the control element 20 with the memory element 40 and/or external connection terminals to which input signals from the outside are input.

The third power supply pattern L3a is formed in a plate shape having a greater width than the third signal pattern L3c. The third power supply pattern L3a is electrically connected with the second power supply pattern L2a by multiple vias 52a. The third power supply pattern L3a is used as both a power supply pattern and a heat dissipation conductor pattern.

The third ground pattern L3b is formed in a plate shape having a greater width than the third signal pattern L3c. The third ground pattern L3b is electrically connected with the second ground pattern L2b by vias 52b. The third ground pattern L3b is used as both a ground pattern and a heat dissipation conductor pattern. A portion of the third ground pattern L3b is formed in a line shape and extends to the region at which the memory element 40 is located.

The first element surface 21 of the control element 20 shown in FIG. 7 is positioned under the layer in which the third power supply pattern L3a, the third ground pattern L3b, and the third signal pattern L3c are located. The third power supply pattern L3a, the third ground pattern L3b, and the third signal pattern L3c are connected with the electrode pads of the control element 20 respectively by a via 53a, a via 53b, and a via 53c shown by broken lines in FIG. 6.

The third power supply pattern L3a is electrically connected with the power supply pads 54a of the control element 20 by the vas 53a, The third ground pattern L3b is electrically connected with the ground pads 54b of the control element 20 by the vias 53b. The third signal patterns L3c are electrically connected with the signal pads 54c of the control element 20 by the vias 53c. The signal patterns of different layers are electrically connected by vias.

The heat that is emitted by the control element 20 is conducted to the first heat dissipation member 31 via the power supply patterns L3a, L2a, and L1a, the ground patterns L3b, L2b, and L1b, the vias 53a, 52a, 51a, 53b, 52b, and 51b, and the thermally-conductive insulating member 14 and is dissipated outside the memory device 1 from the first heat dissipation member 31.

The control element 20 and the first heat dissipation member 31 may be thermally connected by only the power supply pattern. Or, the control element 20 and the first heat dissipation member 31 may be thermally connected by only the ground pattern. In such a case, the ground pattern can be connected with the first heat dissipation member 31 without an insulating member interposed.

On the other hand, as shown in FIG. 2, the heat dissipation structure 32 is formed at the second element surface 22 of the control element 20, The heat dissipation structure 32 includes, for example, multiple metal layers 60, L4, L5, and L5 and multiple heat vias 61, 62, and 63 that connect between these metal layers. The metal layers and the heat vias are made of a material (e.g., copper) similar to that of the multilevel wiring layer 50.

Figure 8:
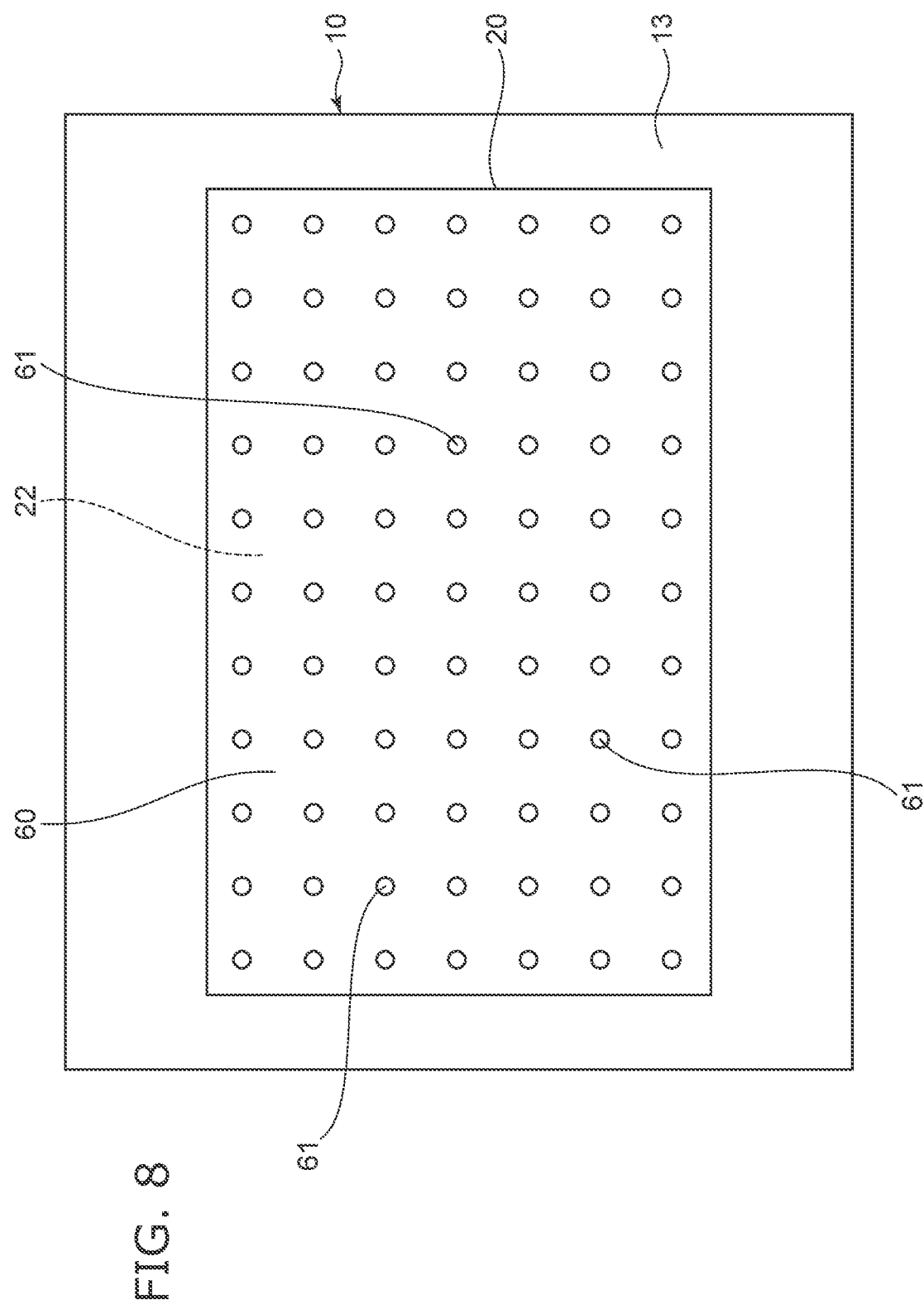
FIG. 8 is a schematic plan view of a second element surface of the control element of the memory device of the first embodiment.

FIG. 8 is a schematic plan view of the second element surface 22 of the control element 20.

At the second element surface 22 of the control element 20, electrode pads are not provided; for example, the silicon surface spreads over the entire surface. The first metal layer 60 is located at the second element surface 22. The first metal layer 60 is not electrically connected with the integrated circuit of the control element 20. The first metal layer 60 covers the entire surface of the second element surface 22.

The multiple first heat vias 61 are connected to the first metal layer 60. The number of the multiple first heat vias 61 is greater than the number of electrode pads located at the first element surface 21 of the control element 20, The first heat vias 61 function as a heat dissipation path. The first heat vias 61 can be located without considering electrical connections with the integrated circuit of the control element 20, Therefore, the heat dissipation from the second element surface 22 side can be increased by using the first heat vias 61 that are more numerous than the electrode pads located at the first element surface 21.

Figure 9:
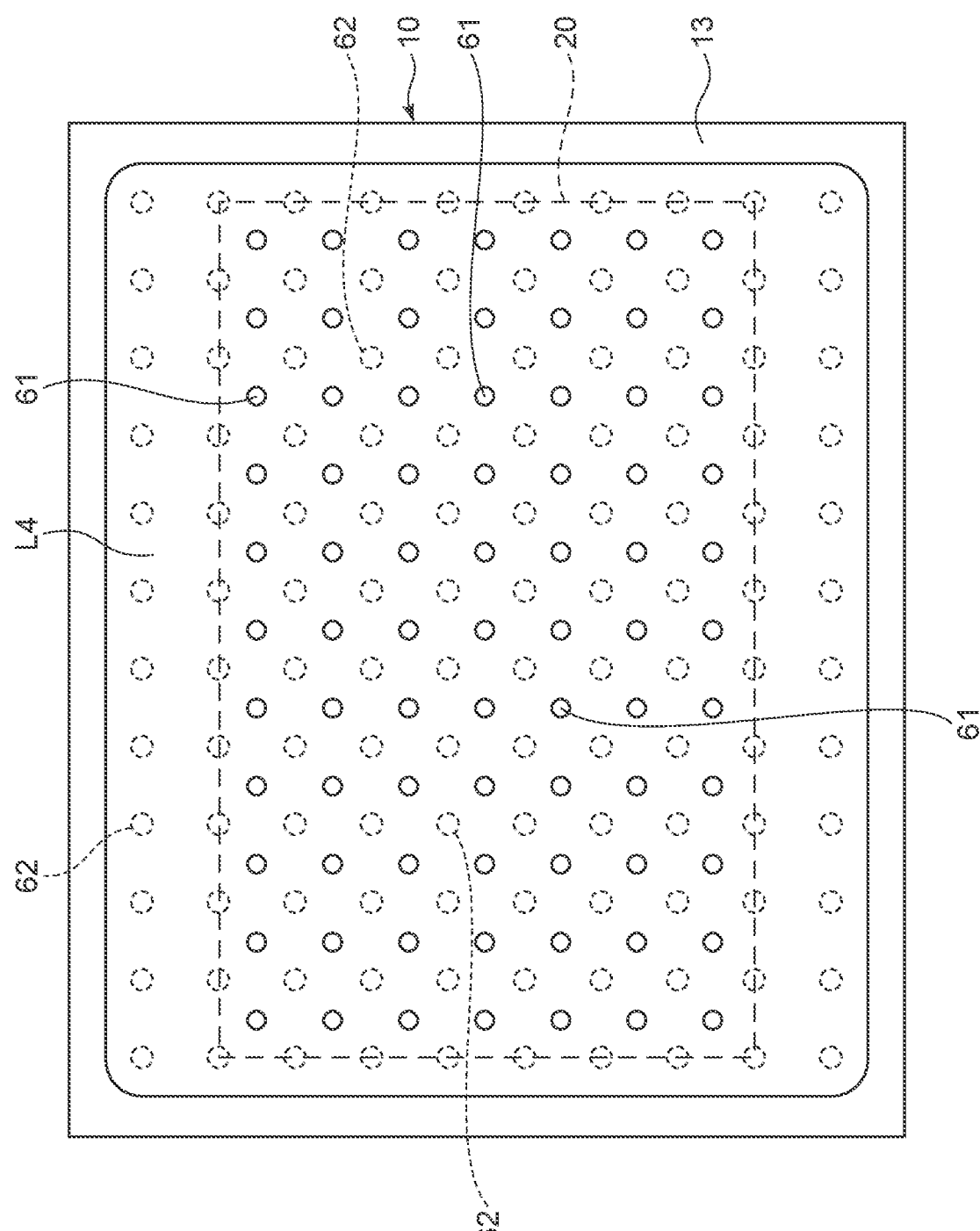
FIG. 9 is a schematic plan view of a heat dissipation structure of the memory device of the first embodiment.

FIG. 9 is a schematic plan view of the second metal layer L4 under the first metal layer 60. The second metal layer L4 spreads through the insulating layer 13 of the wiring substrate 10 with a wider area than the second element surface 22 of the control element 20. The second metal layer L4 is connected with the first metal layer 60 by the multiple first heat vias 61 described above.

Also, the multiple second heat vias 62 are connected to the surface of the second metal layer L4 at the side opposite to the surface connected with the first metal layer 60.

Figure 10:
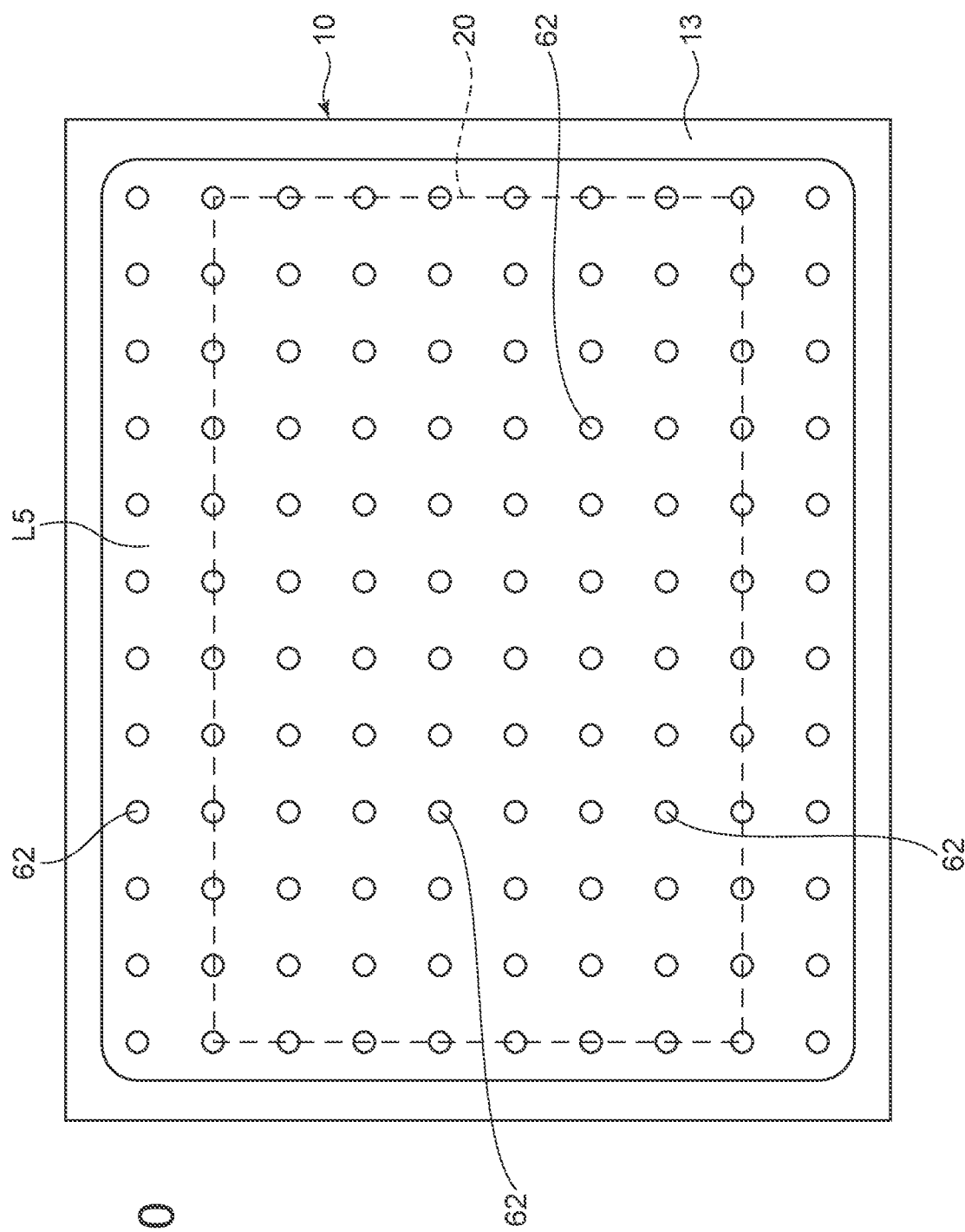
FIG. 10 is a schematic plan view of the heat dissipation structure of the memory device of the first embodiment.

FIG. 10 is a schematic plan view of the third metal layer L5 under the second metal layer L4. The third metal layer L5 spreads through the insulating layer 13 of the wiring substrate 10 with a wider area than the second element surface 22 of the control element 20. The third metal layer L5 is connected with the second metal layer L4 by the multiple second heat vias 62 described above.

Because the area of the second metal layer L4 and the area of the third metal layer L5 are wider than the second element surface 22 of the control element 20, the number of the second heat vias 62 connecting the second metal layer L4 and the third metal layer L5 can be more than the first heat vias 61 connected with the second element surface 22 of the control element 20. The heat dissipation path can be increased thereby, and the heat dissipation can be improved.

Figure 11:
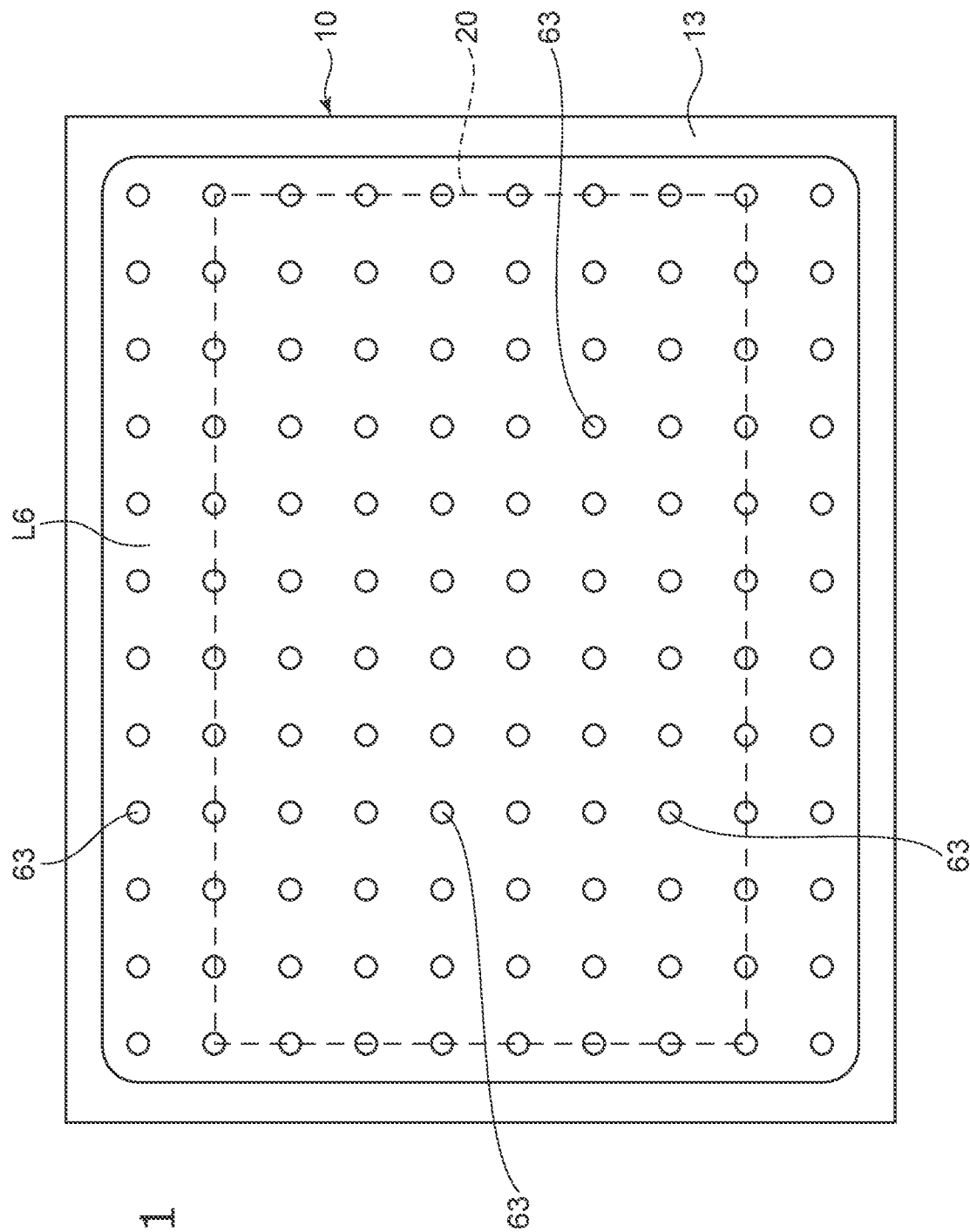
FIG. 11 is a schematic plan view of the heat dissipation structure of the memory device of the first embodiment.

FIG. 11 is a schematic plan view of the fourth metal layer L6 under the third metal layer L5. The fourth metal layer L6 spreads through the insulating layer 13 of the wiring substrate 10 with a wider area than the second element surface 22 of the control element 20. The fourth metal layer L6 is connected with the third metal layer L5 by the multiple third heat vias 63.

Because the area of the third metal layer L5 and the area of the fourth metal layer L6 are wider than the second element surface 22 of the control element 20, the number of the third heat vias 63 connecting the third metal layer L5 and the fourth metal layer L6 can be more than the first heat vias 61 connected with the second element surface 22 of the control element 20, The heat dissipation paths can be increased thereby, and the heat dissipation can be improved.

As shown in FIG. 2, a dielectric protective film (a solder resist) 16 is formed at the second surface 12 side of the wiring substrate 10; and the surface of the fourth metal layer L6 is not covered with the protective film 16.

The heat that is emitted by the control element 20 is dissipated outside the memory device 1 via the metal layers 60, L4, L5, and L6 and the heat vias 61 to 63. The number of layers of the metal layers included in the heat dissipation structure 32 is not limited to the number of layers shown in FIG. 2.

According to the embodiment of the invention, by embedding the control element 20 in the wiring substrate 10, two surfaces (the first element surface 21 and the second element surface 22) of the control element 20 can be connected respectively to the first heat dissipation member 31 and the heat dissipation structure 32 to form heat dissipation paths to two surfaces of the wiring substrate 10. Accordingly, the heat that is emitted by the control element 20 can be efficiently dissipated from the two surfaces via the first heat dissipation member 31 and the heat dissipation structure 32. Also, the memory element 40 is not positioned in the heat dissipation paths from the control element 20 to the first heat dissipation member 31 and the heat dissipation structure 32. According to such an embodiment, the conduction of the heat of the control element 20 to the memory element 40 can be suppressed. Accordingly, the increase of the memory element 40 to a temperature (e.g., not less than 80° C.) that may cause a reduction of the programming speed and/or reading speed can be suppressed.

Figure 12:
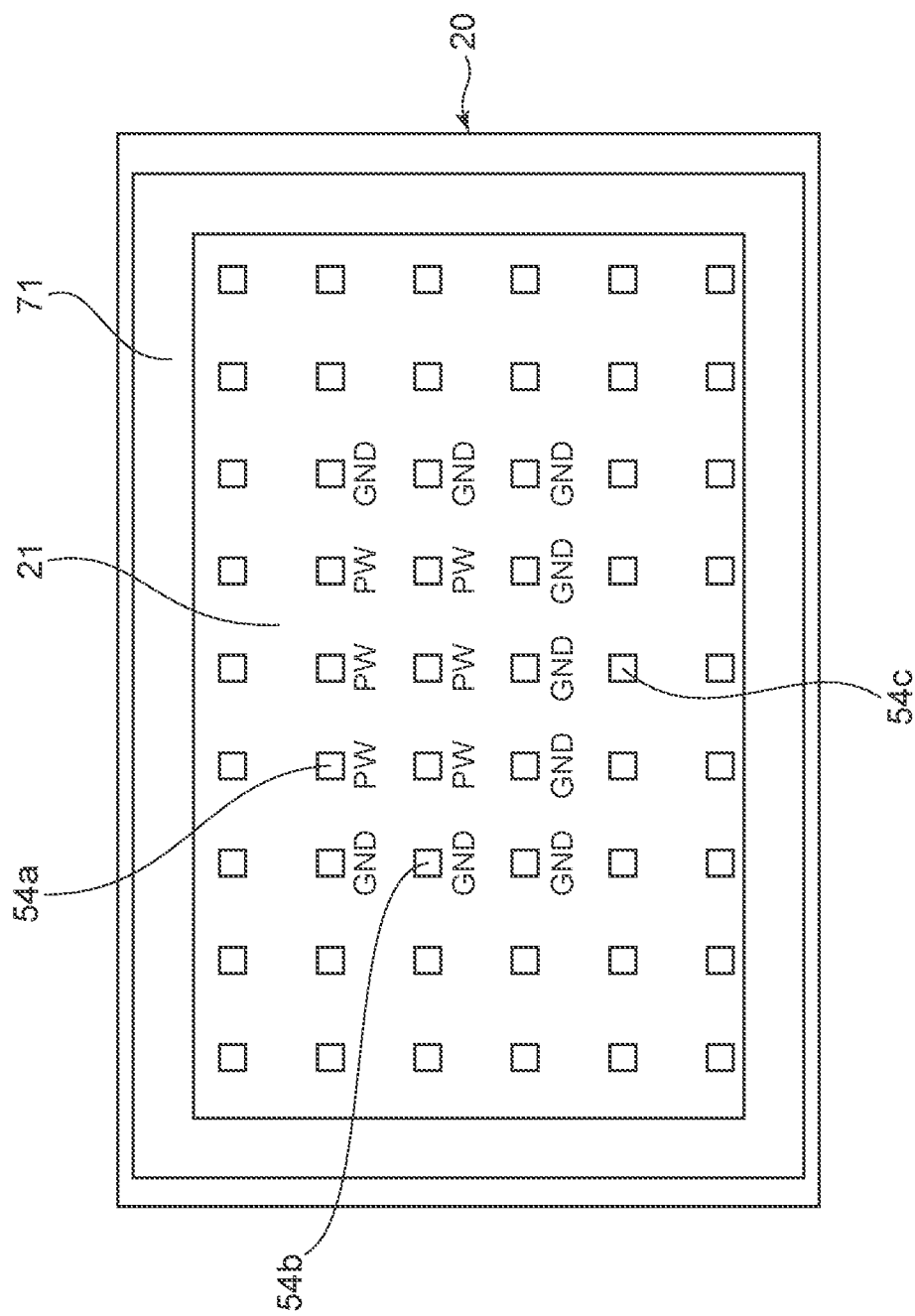
FIG. 12 is a schematic plan view of the first element surface of the control element of the memory device of the first embodiment.
Figure 13:
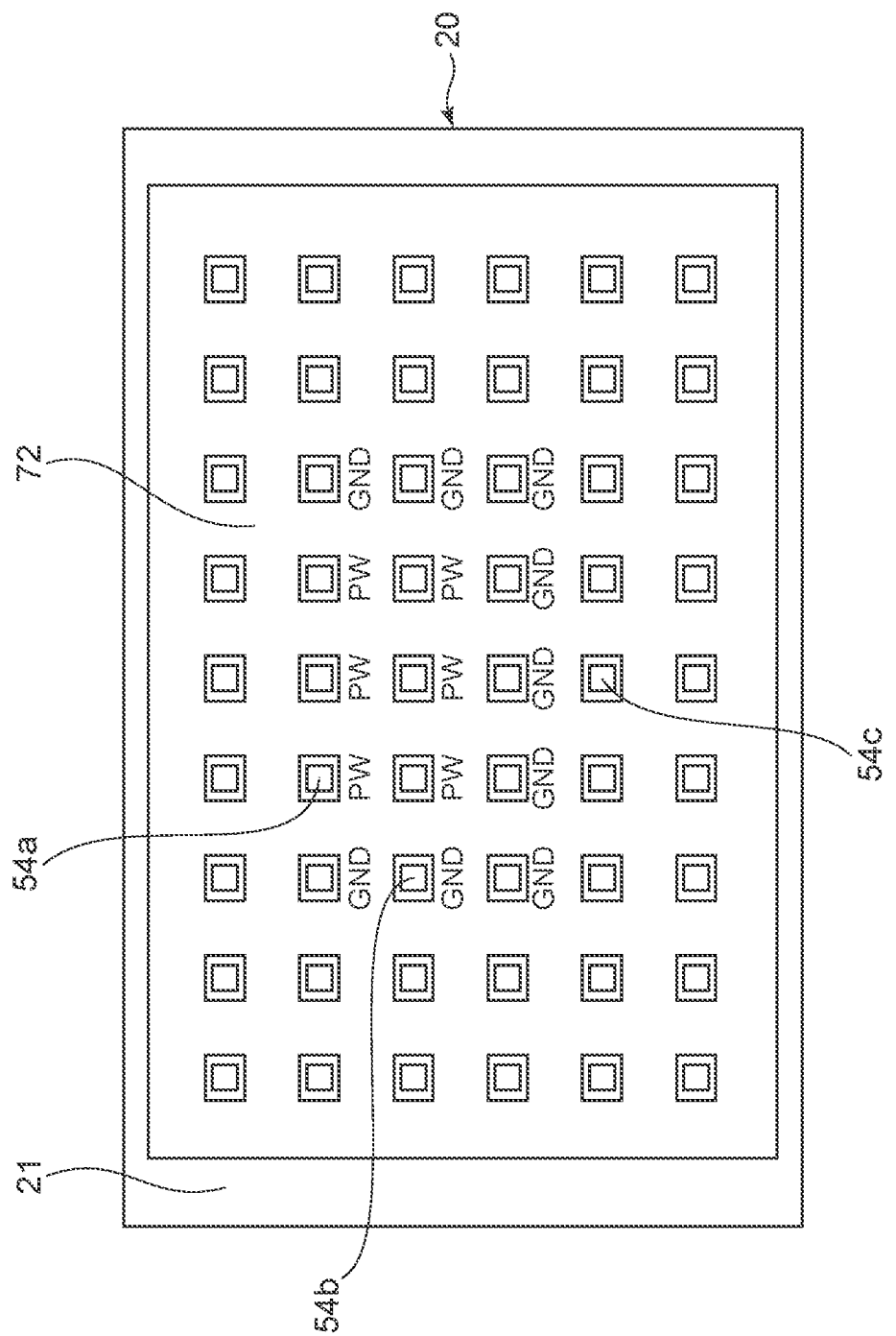
FIG. 13 is a schematic plan view of the first element surface of the control element of the memory device of the first embodiment.

According to the examples shown in FIGS. 12 and 13, metal patterns 71 and 72 that are connected with the first heat dissipation member 31 via the heat dissipation conductor pattern of the wiring substrate 10 but are not connected with the circuit of the control element 20, the electrode pads, or the signal patterns of the wiring substrate 10 are formed at the first element surface 21 of the control element 20.

In the example shown in FIG. 12, the heat ring 71 that surrounds the region in which the multiple electrode pads 54a, 54b, and 54c are located is formed at the first element surface 21 of the control element 20. The heat ring 71 is made of, for example, copper.

In the example shown in FIG. 13, a heat plane 72 is formed at a region of the first element surface 21 of the control element 20 other than the multiple electrode pads 54a, 54b, and 54c. Multiple openings are formed in the heat plane 72; and the electrode pads 54a, 54b, and 54c are positioned in the openings. The heat plane 72 is made of, for example, copper.

Other than the electrode pads 54a, 54b, and 54c, by forming the metal patterns 71 and 72 at the first element surface 21 of the control element 20, the heat dissipation of the first element surface 21 side of the control element 20 can be further increased by connecting the metal patterns 71 and 72 with the first heat dissipation member 31 via the heat dissipation conductor pattern of the wiring substrate 10.

Second Embodiment

Figure 14:
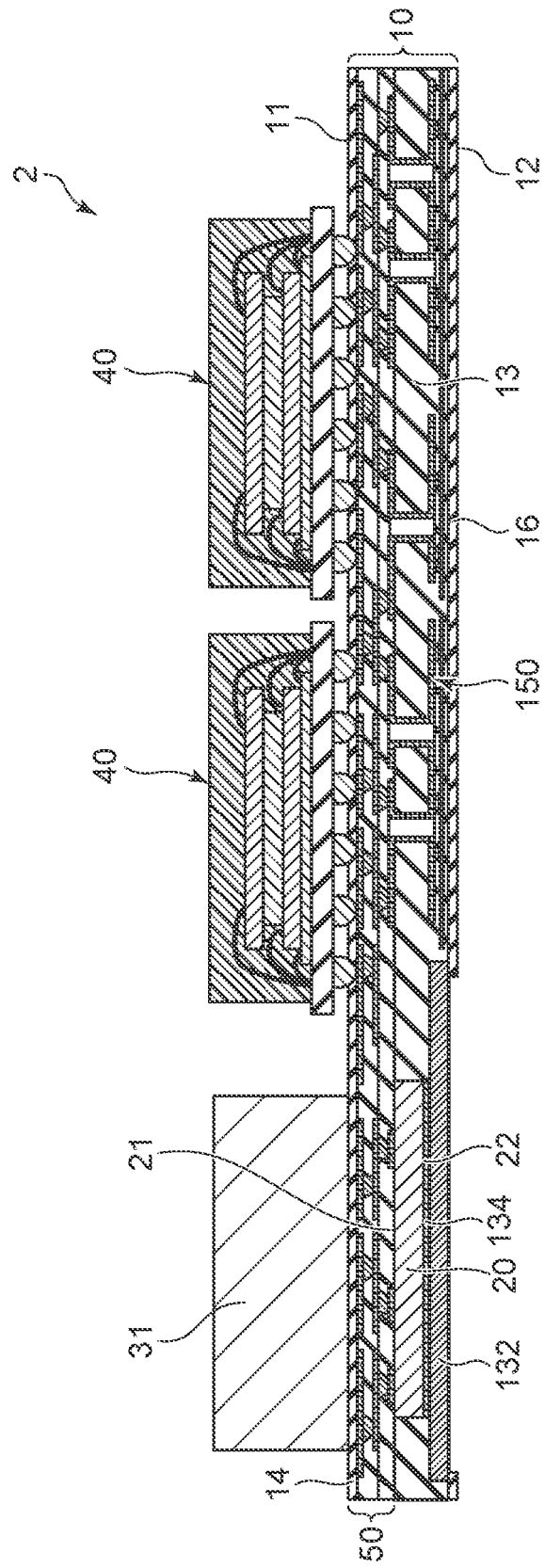
FIG. 14 is a schematic cross-sectional view of a memory device of a second embodiment.

FIG. 14 is a schematic cross-sectional view of a memory device 2 of a second embodiment.

The memory device 2 of the second embodiment includes a second heat dissipation member 132 that is connected to the second element surface 22 as the heat dissipation structure at the second element surface 22 side of the control element 20. For example, the second heat dissipation member 132 is bonded to the second element surface 22 by solder paste 134. The second heat dissipation member 132 is, for example, a metal body made of copper. The second heat dissipation member 132 is embedded in the insulating layer 13 of the wiring substrate 10; one surface contacts the second element surface 22 of the control element 20; and the other surface is exposed at the second surface 12 of the wiring substrate 10, The second heat dissipation member 132 may be copper having a coin shape.

Third Embodiment

Figure 15:
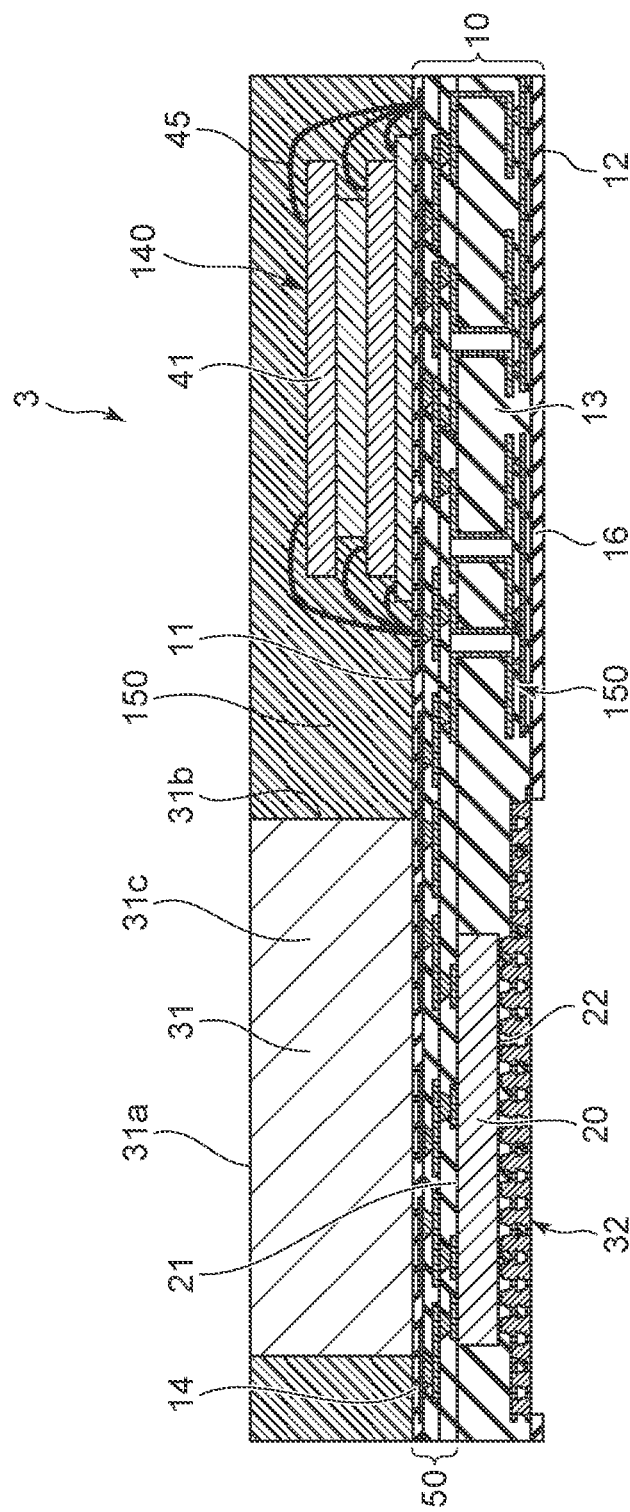
FIG. 15 is a schematic cross-sectional view of a memory device of a third embodiment.

FIG. 15 is a schematic cross-sectional view of a memory device 3 of a third embodiment.

In the memory device 3 of the third embodiment, the multiple memory chips 41 of a memory element 140 are directly stacked on the first surface 11 of the wiring substrate 10 without a substrate or the like interposed. Also, a resin member 150 that covers the multiple memory chips 41 and the metal wires 45 is located on the first surface 11 of the wiring substrate 10.

The resin member 150 covers the side surfaces 31b and 31c of the first heat dissipation member 31. The surface 31a of the first heat dissipation member 31 (the surface at the side opposite to the surface facing the first surface 11 of the wiring substrate 10) is not covered with the resin member 150. The side surfaces 31b and 31c of the first heat dissipation member 31 also may be exposed from the resin member 150.

Fourth Embodiment

Figure 16:
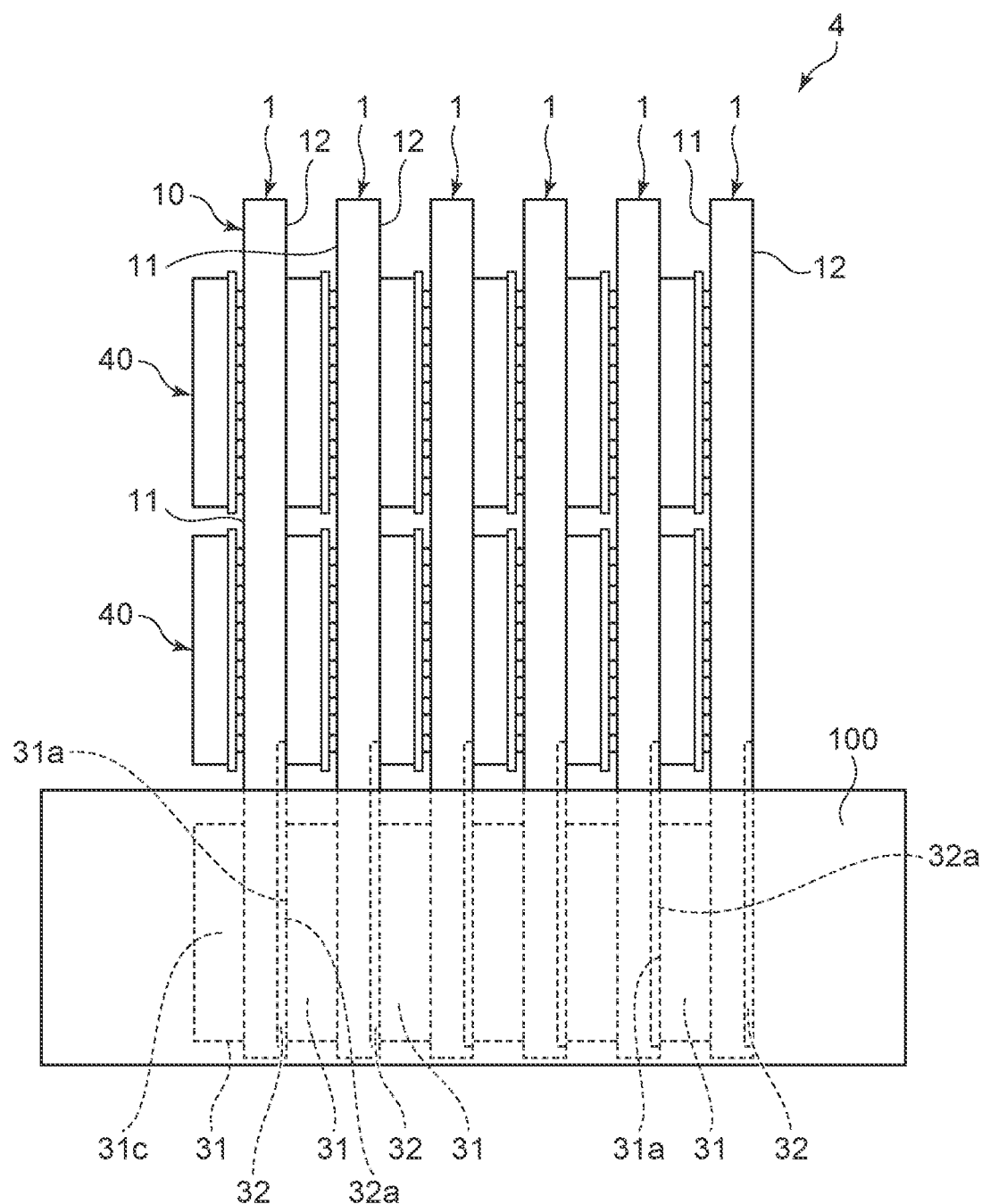
FIG. 16 is a schematic top view of a memory device module of a fourth embodiment.

FIG. 16 is a schematic top view of a memory device module 4 of a fourth embodiment.

The memory device module 4 includes the multiple memory devices 1 of the first embodiment described above and a cooling member 100. The multiple memory devices that are included in the memory device module 4 may have the configuration of the second or third embodiment.

The multiple memory devices 1 are arranged in the lateral direction in FIG. 16 and are included in, for example, large-capacity multiple SSD-mounted memory storage for a data center. For the adjacent wiring substrates 10, the first surface 11 of one wiring substrate 10 faces the second surface 12 of another wiring substrate 10.

In FIG. 16, a module substrate is located in the page surface depth direction, Connectors are located in the page surface depth direction of the wiring substrates 10; and the connectors are inserted into sockets of the module substrate.

The multiple memory devices 1 are arranged so that the surface 31a of the first heat dissipation member 31 of another memory device 1 among adjacent memory devices 1 is connected to a surface 32a of the heat dissipation structure 32 not covered with the wiring substrate 10 of one memory device 1 among the adjacent memory devices 1.

The cooling member 100 extends along the arrangement direction of the multiple memory devices 1 and is connected to the side surface 31c of the first heat dissipation member 31 of the memory devices 1 (the surface at the side opposite to the side inserted into the module substrate). The cooling member 100 includes, for example, a metal member such as a heat sink or the like, an air cooling device such as a fan or the like, a water cooling device, a gas cooling device, or a combination of such components.

According to the embodiment, because the heat dissipation members 31 and 32 of two surfaces of each memory device 1 continuously contact the heat dissipation member 31 and the heat dissipation structure 32 of the other memory devices 1, a larger metal body is configured, and the cooling member 100 is connected to cover the entire metal body; therefore, extremely good heat dissipation of the entire module is obtained.

According to the embodiments described above, the thicknesses of the memory device and the entire memory device module can be reduced by mounting the memory elements 40 and 140 to the same first surface 11 as the mounting surface of the first heat dissipation member 31 and by not mounting the memory elements 40 and 140 to the second surface 12 of the wiring substrate 10.

Other elements and/or more memory elements may be mounted to the region of the second surface 12 of the wiring substrate 10 overlapping the memory element 40. Also, as shown in FIGS. 1, 14, and 15, the multilevel wiring layer 150 may be formed in the region at the second surface 12 side of the wiring substrate 10 overlapping the memory element 40. For example, the multilevel wiring layer 150 is electrically connected with the multilevel wiring layer 50 at the first surface 11 side by IVHs (interstitial via holes).

Fifth Embodiment

Figure 17:
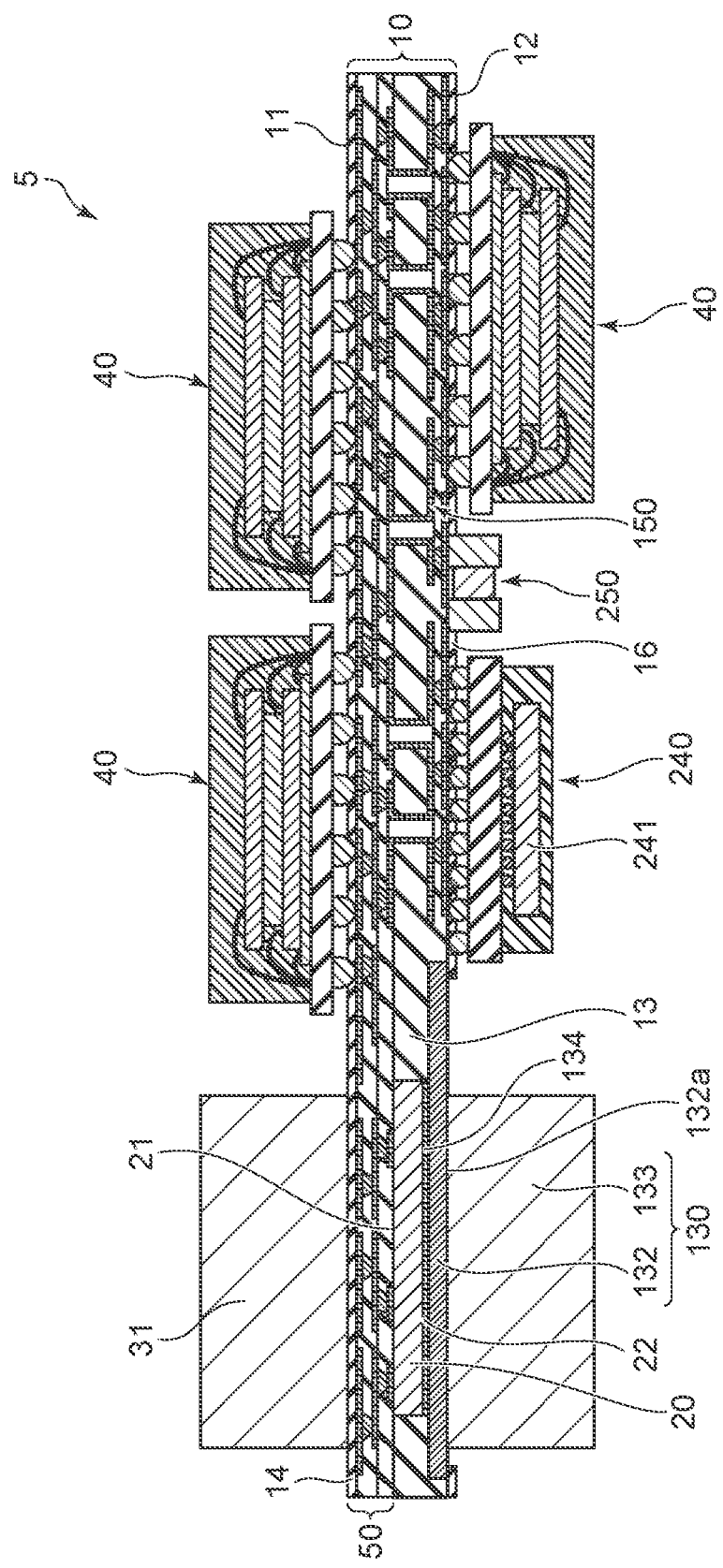
FIG. 17 is a schematic cross-sectional view of a memory device of a fifth embodiment.

FIG. 17 is a schematic cross-sectional view of a memory device 5 of a fifth embodiment.

In the memory device 5 of the fifth embodiment, a heat dissipation structure 130 at the second element surface 22 side of the control element 20 includes the second heat dissipation member 132 that is connected to the second element surface 22 similar to the second embodiment shown in FIG. 14. Furthermore, the heat dissipation structure 130 includes a third heat dissipation member 133 that is connected to a surface 132a of the second heat dissipation member 132 exposed at the second surface 12 of the wiring substrate 10. The third heat dissipation member 133 is exposed outside the wiring substrate 10 at the second surface 12 side of the wiring substrate 10 and can be set to be thicker than the second heat dissipation member 132 embedded in the wiring substrate 10. The third heat dissipation member 133 is, for example, a metal member that includes multiple fins.

Also, the memory device 5 of the fifth embodiment has a two-sided mounting structure. Another memory element 240 is mounted to the region of the second surface 12 of the wiring substrate 10 overlapping the memory element 40, The memory element 240 includes, for example, a DRAM chip 241.

Also, in the region of the second surface 12 of the wiring substrate 10 overlapping the memory element 40, for example, a passive element 250 such as a resistance, a capacitor, or the like, and/or the same memory element 40 as the memory element 40 mounted to the first surface 11 also can be mounted. The height of the third heat dissipation member 133 protruding from the second surface 12 of the wiring substrate 10 is greater than the height of the memory element 40, the height of the memory element 240, and the height of the passive element 250.

The multilevel wiring layer 150 that is electrically connected with the control element 20 is formed at the second surface 12 side of the wiring substrate 10, Also, for example, the multilevel wiring layer 150 is electrically connected with the multilevel wiring layer 50 at the first surface 11 side by IVHs. The memory element 240, the passive element 250, and the memory element 40 that are mounted to the second surface 12 are electrically connected with the multilevel wiring layer 150.

Sixth Embodiment

Figure 18:
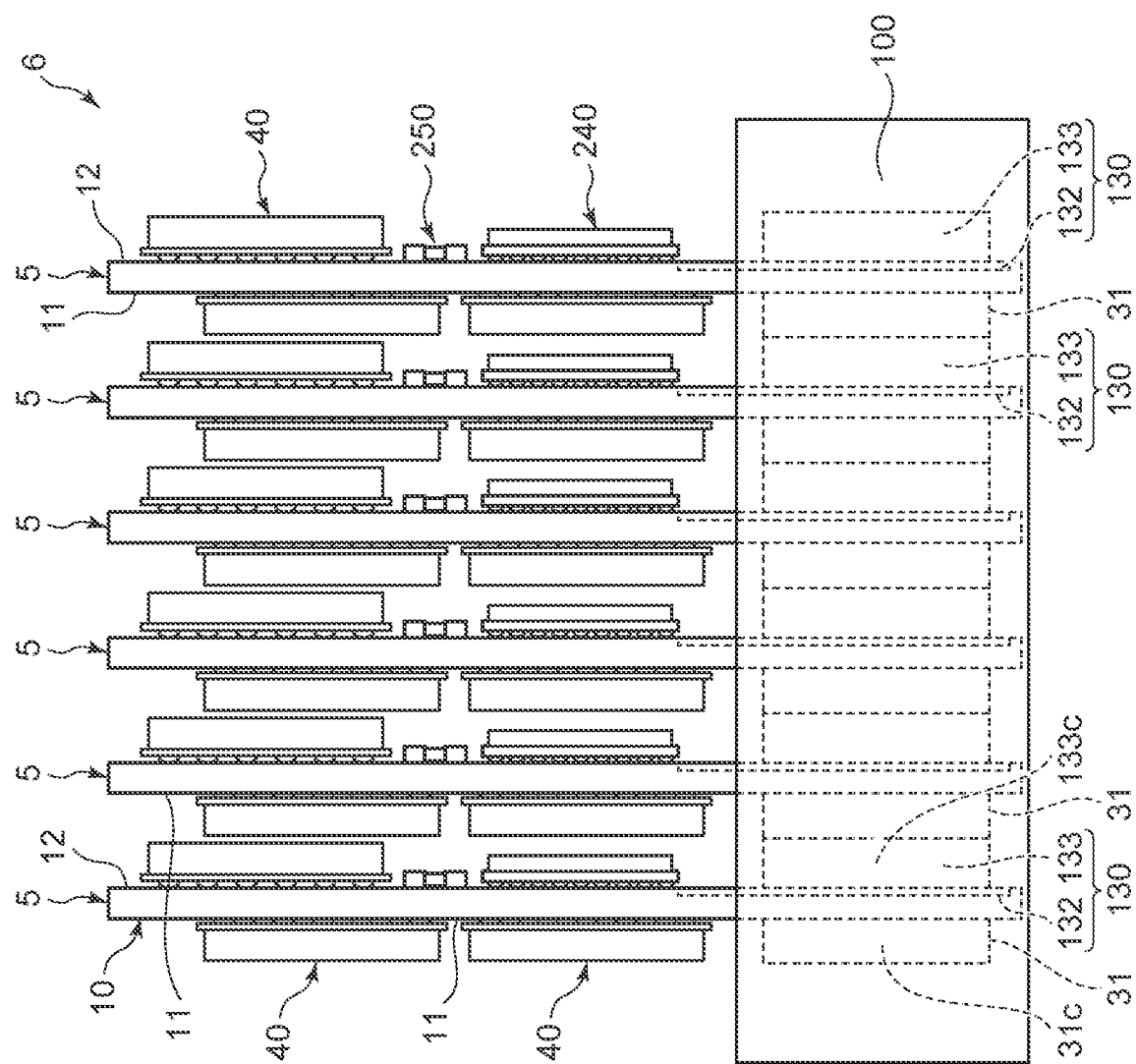
FIG. 18 is a schematic top view of a memory device module of a sixth embodiment.

FIG. 18 is a schematic top view of a memory device module 6 of a sixth embodiment.

The memory device module 6 includes the multiple memory devices 5 of the fifth embodiment described above and the cooling member 100.

The multiple memory devices 5 are arranged in the lateral direction in FIG. 18 and are included in, for example, a large-capacity multiple SSD-mounted memory storage for a data center. For the adjacent wiring substrates 10, the first surface 11 of one wiring substrate 10 faces the second surface 12 of another wiring substrate 10.

In FIG. 18, a module substrate is located in the page surface depth direction. Connectors are located in the page surface depth direction of the wiring substrates 10; and the connectors are inserted into sockets of the module substrate.

The multiple memory devices 5 are arranged so that the first heat dissipation member 31 of another memory device 5 among adjacent memory devices 5 is connected to the third heat dissipation member 133 of one memory device 5 among the adjacent memory devices 5.

The cooling member 100 extends along the arrangement direction of the multiple memory devices 5 and is connected to the side surface 31c of the first heat dissipation member 31 and a side surface 133c of the third heat dissipation member 133 of each memory device 5. The cooling member 100 includes, for example, a metal member such as a heat sink or the like, an air cooling device such as a fan or the like, a water cooling device, a gas cooling device, or a combination of such components.

According to the embodiment, because the heat dissipation members 31 and 133 of the two surfaces of each memory device 5 continuously contact the heat dissipation members 31 and 133 of the other memory devices 5, a larger metal body is configured, and the cooling member 100 is connected to cover the entire metal body; therefore, extremely good heat dissipation of the entire module is obtained.

While certain embodiments of the inventions have been described, these embodiments have been presented by way of example only, and are not intended to limit the scope of the inventions. These novel embodiments may be embodied in a variety of other forms; and various omissions, substitutions, and changes may be made without departing from the spirit of the inventions. Such embodiments and their modifications are within the scope and spirit of the inventions, and are within the scope of the inventions described in the claims and their equivalents.

REFERENCE NUMERAL LIST 1 to 3, 5 memory device
4, 6 memory device module
10 wiring substrate
11 first surface
12 second surface
13 insulating layer
20 control element
21 first element surface
22 second element surface
31 first heat dissipation member
32, 130 heat dissipation structure 40 memory element
50 multilevel wiring layer
100 cooling member
132 second heat dissipation member
133 third heat dissipation member

The invention claimed is:

1. A memory device, comprising:
a wiring substrate including a first surface, a second surface, and a multilevel wiring layer, the second surface being at a side opposite to the first surface;
a control element embedded in the wiring substrate, the control element including
a first element surface at which a plurality of electrode pads is located, the plurality of electrode pads being connected with the multilevel wiring layer, and
a second element surface at a side opposite to the first element surface;
a first heat dissipation member located at a region of the first surface of the wiring substrate overlapping the control element;
a heat dissipation structure facing the second element surface of the control element, the heat dissipation structure being exposed at the second surface of the wiring substrate; and
at least one memory element located at a region of the first surface of the wiring substrate not overlapping the control element, the at least one memory element being connected with the multilevel wiring layer,
the multilevel wiring layer including
a signal pattern electrically connecting the control element with the memory element or an external connection terminal, and
a heat dissipation conductor pattern forming a heat dissipation path between the control element and the first heat dissipation member.

2. The memory device according to claim 1, wherein
at least one memory element is further provided at a region of the second surface of the wiring substrate not overlapping the control element, and
the at least one memory element is connected with the multilevel wiring layer.

3. The memory device according to claim 2, wherein
the heat dissipation structure includes a third heat dissipation member protruding from the second surface of the wiring substrate.

4. A memory device module, comprising:
a plurality of the memory devices according to claim 3; and
a cooling member,
the plurality of memory devices being arranged so that the first heat dissipation member of an other memory device among adjacent memory devices of the plurality of memory devices is connected to the third heat dissipation member of the heat dissipation structure of one memory device among the adjacent memory devices, the third heat dissipation member being exposed from the wiring substrate of the heat dissipation structure,
the cooling member extending along an arrangement direction of the plurality of memory devices,
the cooling member being connected to side surfaces of the first heat dissipation members and side surfaces of the third heat dissipation members.

5. The memory device according to claim 1, wherein
the plurality of electrode pads of the control element include a power supply pad and a ground pad, a power supply potential being applied to the power supply pad, a ground potential being applied to the ground pad, and
the heat dissipation conductor pattern includes at least one of:
a power supply pattern connected with the power supply pad, the power supply pattern having a greater width than the signal pattern; or
a ground pattern connected with the ground pad, the ground pattern having a greater width than the signal pattern.

6. The memory device according to claim 5, wherein
at least one memory element is further provided at a region of the second surface of the wiring substrate not overlapping the control element, and
the at least one memory element is connected with the multilevel wiring layer.

7. The memory device according to claim 1, wherein
a metal pattern is located at the first element surface of the control element,
the metal pattern is not connected with the plurality of electrode pads of the control element or the signal pattern of the wiring substrate, and
the metal pattern is connected with the heat dissipation conductor pattern.

8. The memory device according to claim 7, wherein
at least one memory element is further provided at a region of the second surface of the wiring substrate not overlapping the control element, and
the at least one memory element is connected with the multilevel wiring layer.

9. The memory device according to claim 1, wherein
the heat dissipation structure includes:
a metal layer located at the second element surface of the control element, and
a plurality of heat vias connected to the metal layer, and
the plurality of heat vias is more numerous than the plurality of electrode pads.

10. The memory device according to claim 1, wherein
the heat dissipation structure includes a second heat dissipation member embedded in the wiring substrate.

11. A memory device module, comprising:
a plurality of the memory devices according to claim 1; and
a cooling member,
the plurality of memory devices being arranged so that the first heat dissipation member of an other memory device among adjacent memory devices of the plurality of memory devices is connected to a surface of the heat dissipation structure of one memory device among the adjacent memory devices, the surface being exposed from the wiring substrate,
the cooling member extending along an arrangement direction of the plurality of memory devices,
the cooling member being connected to side surfaces of the first heat dissipation members.

* * * * *